United States Patent
Thiemann

[19]

[11] Patent Number: 6,165,848
[45] Date of Patent: *Dec. 26, 2000

[54] METHOD FOR THE PRODUCTION OF A MOS-CONTROLLED POWER SEMICONDUCTOR COMPONENT

[75] Inventor: Uwe Thiemann, Wutöschingen, Germany

[73] Assignee: Asea Brown Boveri AG, Baden, Switzerland

[*] Notice: This patent issued on a continued prosecution application filed under 37 CFR 1.53(d), and is subject to the twenty year patent term provisions of 35 U.S.C. 154(a)(2).

[21] Appl. No.: 08/980,261

[22] Filed: Nov. 28, 1997

[30] Foreign Application Priority Data

Dec. 23, 1996 [DE] Germany ............................ 196 54 113

[51] Int. Cl.[7] ...................... H01L 21/336; H01L 21/8249
[52] U.S. Cl. ........................... 438/268; 438/234; 438/236
[58] Field of Search .................................. 438/268, 234, 438/236, 204

[56] References Cited

U.S. PATENT DOCUMENTS

| | | |
|---|---|---|
| 4,639,754 | 1/1987 | Wheatley, Jr. et al. . |
| 4,851,888 | 7/1989 | Ueno . |
| 5,258,636 | 11/1993 | Rumennik et al. ...................... 257/339 |
| 5,354,421 | 10/1994 | Tatsumi et al. ........................... 156/662 |
| 5,451,798 | 9/1995 | Tsuda et al. . |
| 5,538,908 | 7/1996 | Kim ........................................ 438/204 |

FOREIGN PATENT DOCUMENTS

| | | |
|---|---|---|
| 0 561 267 | 9/1993 | European Pat. Off. . |
| 0 615 293 | 9/1994 | European Pat. Off. . |
| 0 690 512 | 1/1996 | European Pat. Off. . |
| 0690512A1 | 3/1996 | European Pat. Off. ........ H01L 29/72 |
| 35 19 389 | 12/1989 | Germany . |
| 40 13 643 | 10/1990 | Germany . |
| 43 01 947 | 8/1993 | Germany . |
| 43 15 178 | 11/1994 | Germany . |

OTHER PUBLICATIONS

Wolf, Silicon Processing for the VLSI Era, vol. 2: Process Integration, Lattice Press, Sunset Beach, CA, p. 323, No Month 1990.

*Primary Examiner*—Richard Booth
*Assistant Examiner*—Walter Lindsay, Jr.
*Attorney, Agent, or Firm*—Oblon, Spivak, McClelland, Maier & Neustadt, P.C.

[57] ABSTRACT

The invention relates to a method for the production of a MOS-controlled power semiconductor component (30), which power semiconductor component (30) comprises, in a common substrate (31), a plurality of component cells which are arranged next to one another and are connected in parallel. A bipolar transistor formed by a collector region (33) of a first conductivity type, a superior base region (32) of a second conductivity type and an emitter region (37) of the first conductivity type, which emitter region is incorporated from above into the base region (32), is present in each component cell (59). A MOS channel structure (39, 42, 43) for controlling the bipolar transistor is provided on the emitter side, which MOS channel structure (39, 42, 43) comprises a source region (43) of the second conductivity type, which source region lies above the emitter region (37), a channel region (42) of the first conductivity type, which channel region as arranged on the edge side of the emitter region (37) between the source region (43) and the base region (32), and a gate electrode (39) which is arranged in an insulated manner above the channel region (42). Simple setting of the current density in the event of a short circuit and of the hole bypass resistance without additional process complexity is achieved by virtue of the fact that the channel width of the MOS channel structure (39, 42, 43) is structured and the structuring of the channel width of the MOS channel structure (39, 42, 43) is effected indirectly by means of one of the other mask steps used in the production process of the component.

9 Claims, 7 Drawing Sheets

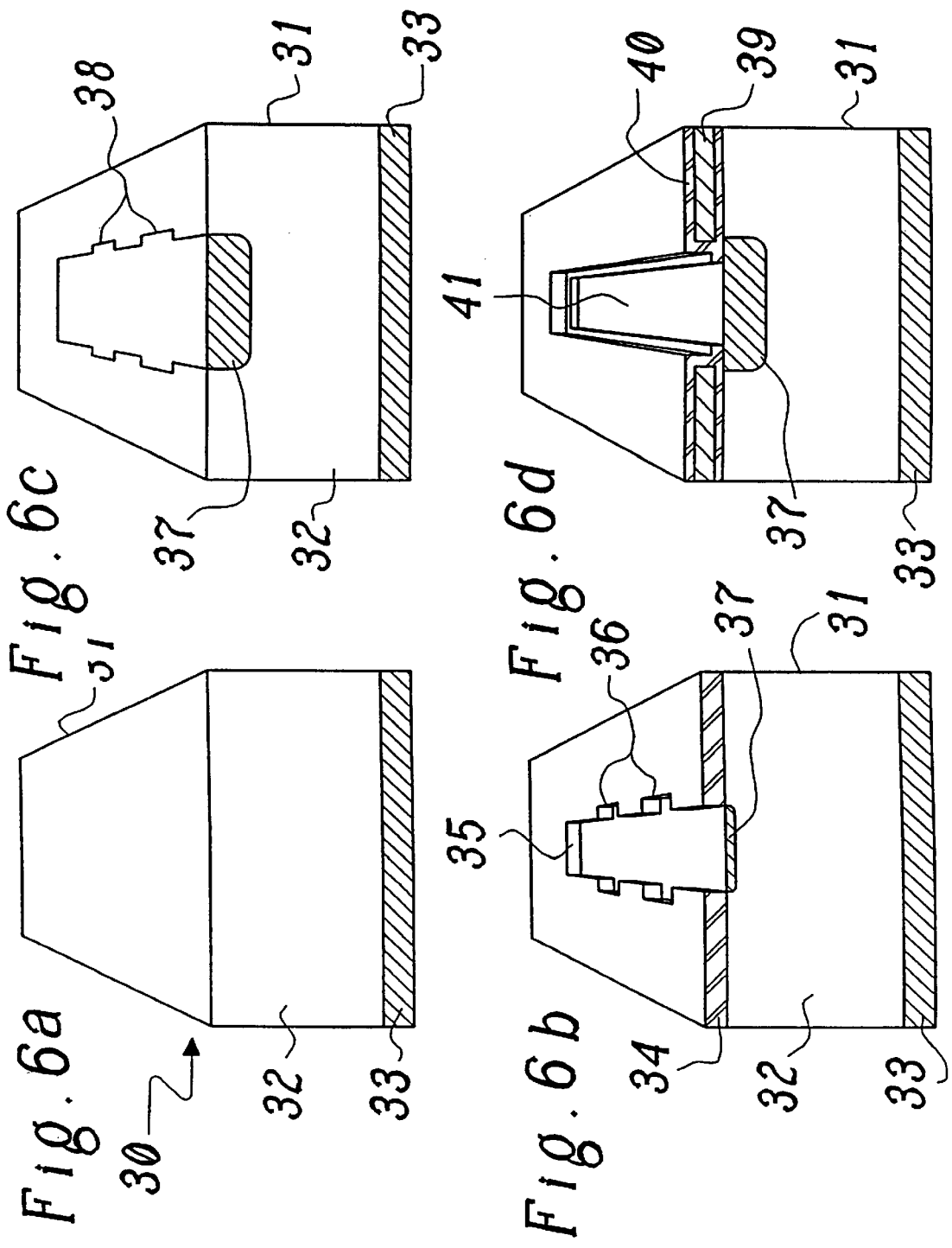

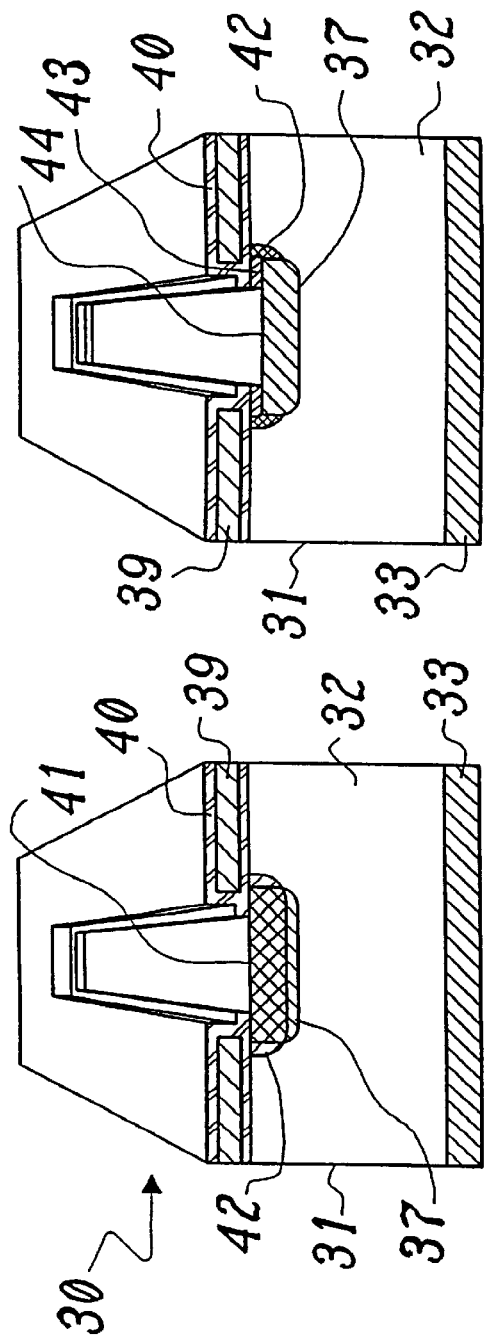
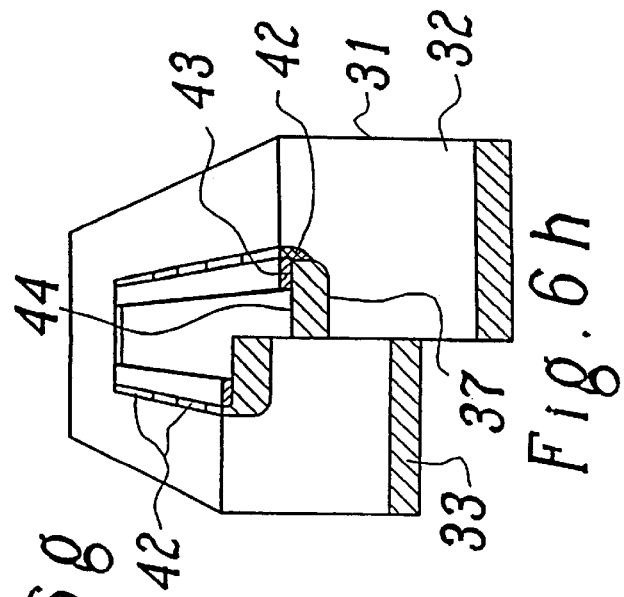
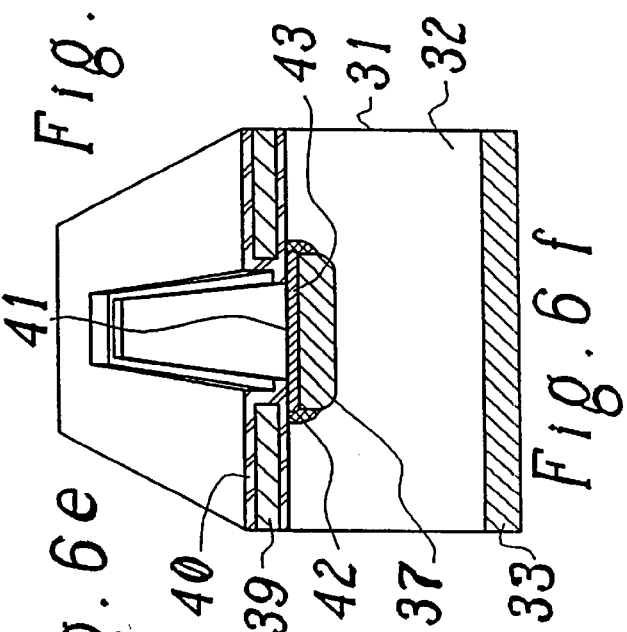
Fig. 6e
Fig. 6f
Fig. 6g
Fig. 6h

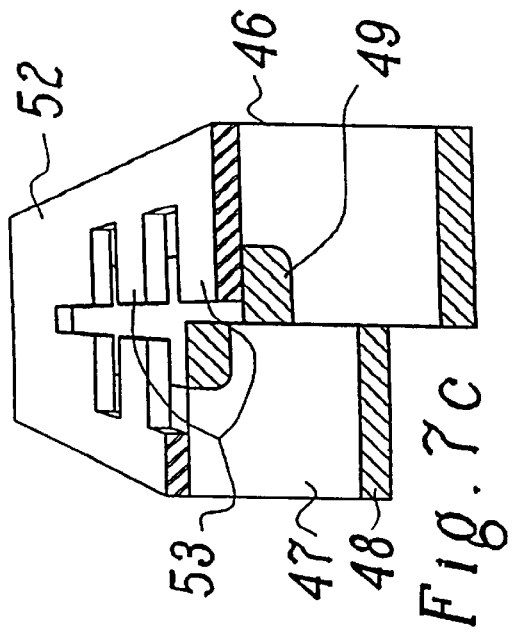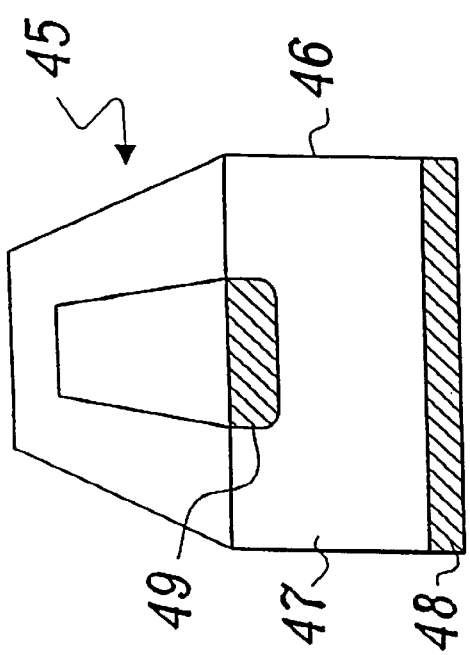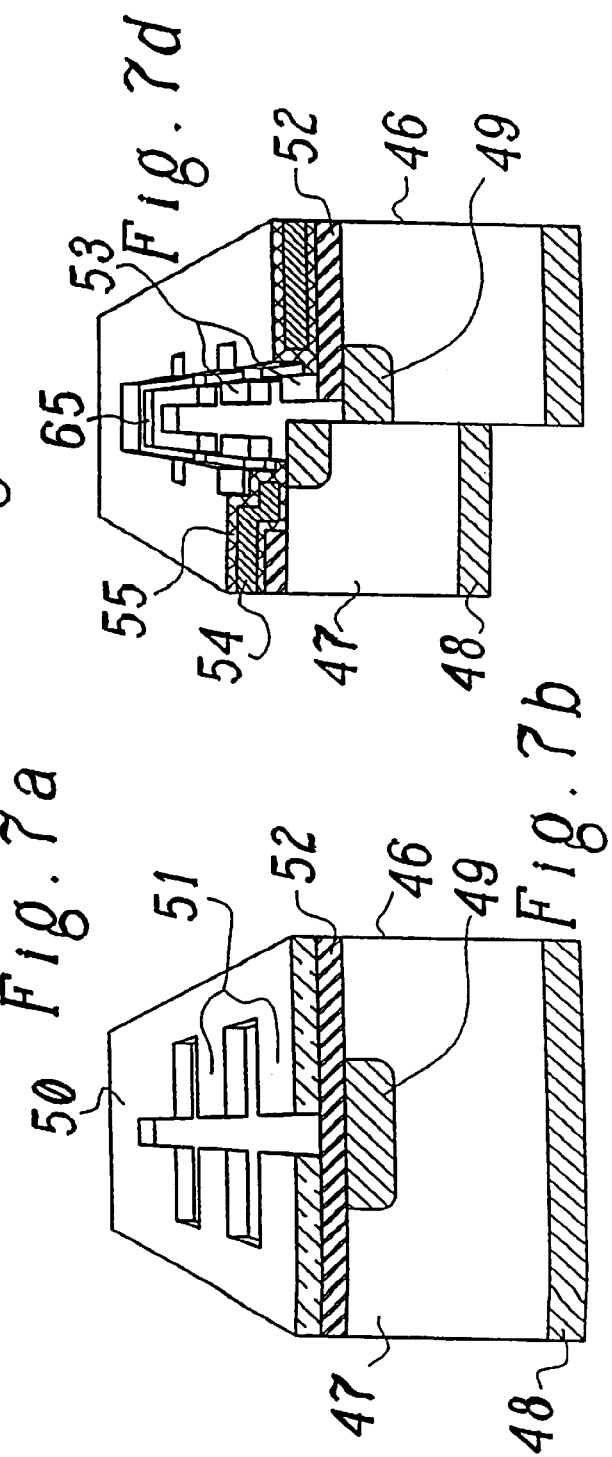

6,165,848

METHOD FOR THE PRODUCTION OF A MOS-CONTROLLED POWER SEMICONDUCTOR COMPONENT

BACKGROUND OF THE INVENTION

1. Field of the Invention

The present invention is concerned with the field of power electronics. It relates to a method for the production of a MOS-controlled power semiconductor component, which power semiconductor component comprises, in a common substrate, a plurality of component cells which are arranged next to one another and are connected in parallel, a bipolar transistor formed by a collector region of a first conductivity type, a superior base region of a second conductivity type and an emitter region of the first conductivity type, which emitter region is incorporated from above into the base region, being present in each component cell, and a MOS channel structure for controlling the bipolar transistor being provided on the emitter side, which MOS channel structure comprises a source region of the second conductivity type, which source region lies above the emitter region, a channel region of the first conductivity type, which channel region is arranged on the edge side of the emitter region between the source region and the base region, and a gate electrode which is arranged in an insulated manner above the channel region.

2. Discussion of Background

Today's MOS-controlled power semiconductor components of the IGBT type (Insulated Gate Bipolar Transistors) comprise a multiplicity of identical component cells which are connected in parallel and are accommodated next to one another in a common semiconductor substrate. A bipolar transistor is component cells of such a power semiconductor component 1, one of which is represented in cross-section in FIG. 1 by way of example, which bipolar transistor comprises a ($P^+$-doped) collector region 4, an (N-doped) base region 3 and a ($P^+$-doped) emitter region 6. On the emitter side of the IGBT, a MOS channel structure of the cell, which comprises a (P-doped) channel region 7, an ($N^+$-doped) source region 8 and a (polysilicon) gate electrode 9 arranged in an insulated manner above the channel region 7, is used to control the base current of the integrated bipolar transistor.

For this purpose, the channel region 7 connects the source region 8 to the base region 3, that is to say to the base of the bipolar transistor. The base region 3 is part of a continuous base layer. The collector region 4 is part of a continuous collector layer. The gate electrode 9 is insulated by an oxide 10 from the inferior substrate 2 and the superior metallization layer of the emitter contact 11. The emitter contact simultaneously makes contact with the emitter region 6 and the source region 8. A collector metallization layer 5 is provided on the underside of the substrate 2 in order to make contact with the IGBT on the collector side.

The lateral extent of the component cells may follow different geometries. Two examples of cell geometries known and employed today are represented in a plan view from above in FIG. 2(a) and (b). FIG. 2(a) shows a strip structure with an elongate emitter region 6, on the two long sides of which two source regions 8 in strip form are superposed and which is surrounded entirely by the gate electrode 9. FIG. 2(b) shows a polygonal (in this case hexagonal) cell structure, in which a central polygonal emitter region 6' is covered on the edge side by a continuous, annular source region 8' and is enclosed by a gate electrode 9'. The emitter contact has been omitted in both examples.

One problem that arises with an IGBT is the so-called latch-up strength of the components: if the hole current of the bipolar transistor is too high, the parasitic thyristor formed by the source region 8, the emitter region 6, the base region 3 and the collector region 4 may be triggered. Furthermore, in the event of a short circuit, the power density in the region of the MOS channel structure may become so high that thermal destruction of the component occurs. It is therefore fundamentally desirable to limit the short-circuit current (power limiting in the event of a short circuit) and, in addition, to keep the hole bypass resistance around the source region 8 as small as possible (reduction in the latch-up sensitivity). These measures should be achieved with minimum additional outlay in terms of process technology (costs).

Nowadays, uniform source regions are used in a number of IGBTs, which means that a mask is saved: the ($N^+$-type) source regions are implanted without a mask. The implantation is masked by a thick oxide outside the active component area. During contact hole etching, etching into the topmost silicon layer is then additionally effected and the $N^+$-type layer is removed again. This produces a lateral contact to the source region at the edge of the contact hole window.

Such maskless source region implantation is represented in FIGS. 3 and 4 in a cross-section through a component cell of a power semiconductor component 12: in the case of this component, a collector region (a collector layer) 15 is initially introduced from underneath into the N-doped substrate 13, which simultaneously forms the base region 14. An emitter region 17 and the channel regions 18 are furthermore introduced from above—through a window 21 and masked by the subsequent gate electrode 19. A source region 22 is then implanted, masked by the gate electrode 19, the central region of which source region is etched away in order to produce a contact hole 23 (FIG. 4). Through the contact hole 23, an emitter contact 24 makes contact both with the emitter region 17 and the source regions 22. Contact is made on the collector side by means of a collector metallization layer 16.

The disadvantage of this technology is that the $N^+$-type layer or the source region 22 is not structured along the edge of the polysilicon gate electrode, that is to say along the edge of the contact hole 23. This results in a large channel width (region over which the channel is effective) for the MOS channel structure, whereby the power density per IGBT cell becomes very large in the event of a short circuit.

In the case of other known types of IGBT, a separate photoresist mask is used for the implantation of the source region 22. Such a mask 25, of the kind suitable for a cell geometry according to FIG. 2(a), is represented as a detail in a plan view in FIG. 5(a). Small mask openings 26 are provided in two rows in this mask 25, through which openings the $N^+$ implantation is carried out. The resulting cell structure has—in comparison with FIG. 2(a)—the arrangement of gate region 27, emitter region 28 and insular source regions 29 that is shown in FIG. 5(b). This makes it possible, although at the cost of increasing process complexity, to set the channel width and thus the power density in the event of a short circuit by design (above all of the source regions). A further advantage of this method is that the lateral limiting of the $N^+$-type source region creates a hole bypass which reduces the latch-up sensitivity of the component. As already mentioned, however, this solution requires at least one additional mask step, which undesirably complicates the production process.

SUMMARY OF THE INVENTION

Accordingly, one object of the invention is to provide a novel method for the production of a power IGBT component which permits the production of an IGBT with power limiting in the event of a short circuit and a reduced hole bypass resistance with little additional process complexity.

The object is achieved, in the case of a method of the type mentioned in the introduction, by virtue of the fact that the channel width of the MOS channel structure is structured, and that the structuring of the channel width of the MOS channel structure is effected indirectly by means of one of the other mask steps used in the production process of the component. The structuring of the channel width of the MOS channel structure enables the channel width and thus the power in the event of a short circuit and the hole bypass resistance to be set to the desired values. The use of a special additional mask for this structuring is obviated by the use of a mask step that is already present in the process.

A first preferred embodiment of the method according to the invention is characterized by the fact that that mask step by means of which the emitter region is introduced into the substrate is used to structure the channel width of the MOS channel structure, that a mask is used for the mask step by means of which the emitter region is introduced into the substrate, which mask has cutouts which are arranged around the edge of a mask opening and extend laterally outwards, in such a way that the introduced emitter region has laterally outwardly extending fingers in the region of the cutouts, and that the length of the fingers is selected such that they project laterally at least beyond the subsequently introduced source region. The formation of a control channel under operating conditions is deliberately and locally prevented by the fingers in a simple manner. Both the level of the saturation current (power density in the event of a short circuit) and the hole bypass resistance can be set in a simple and reliable manner by the width, depth and number of fingers.

A second preferred embodiment of the method according to the invention is distinguished by the fact that a field oxide layer is arranged on the top side of the substrate between the component cells, and that mask step by means of which the field oxide layer on the substrate is structured is used to structure the channel width of the MOS channel structure, that a mask is used for the mask step by means of which the field oxide layer on the substrate is structured, which mask has first fingers which proceed from the edge of the mask region surrounding the component cell and extend inwards, in such a way that the applied field oxide layer, which surrounds the component cells, has inwardly extending, second fingers in the region of the cutouts, which second fingers prevent or mask formation of the source region in their region during the subsequent introduction of said source region. In this case, too, both the level of the saturation current and the hole bypass resistance can be set in a simple and reliable manner by the width, depth and number of second fingers.

A further preferred embodiment of the method according to the invention is characterized by the fact that that mask step by means of which the gate electrode on the substrate is structured is used to structure the channel width of the MOS channel structure, that a mask is used for the mask step by means of which the gate electrode on the substrate is structured, which mask has first fingers which proceed from the edge of the mask region surrounding the component cell and extend inwards, in such a way that the applied gate electrode has inwardly extending, second fingers in the region of the cutouts, which second fingers prevent or mask the formation of a channel structure in their region during the subsequent introduction of the source region. In this case, too, the desired parameters are set by way of the geometry of the second fingers.

Further embodiments emerge from the dependent claims.

BRIEF DESCRIPTION OF THE DRAWINGS

A more complete appreciation of the invention and many of the attended advantages thereof will be readily obtained as the same becomes better understood by reference to the following detailed description when considered in connection with the accompanying drawings, wherein:

FIG. 6 shows various steps in the production of an IGBT in accordance with a first preferred exemplary embodiment of the method according to the invention, in which the emitter region is structured in order to structure the MOS channel structure;

DESCRIPTION OF THE PREFERRED EMBODIMENTS

Figure 1:
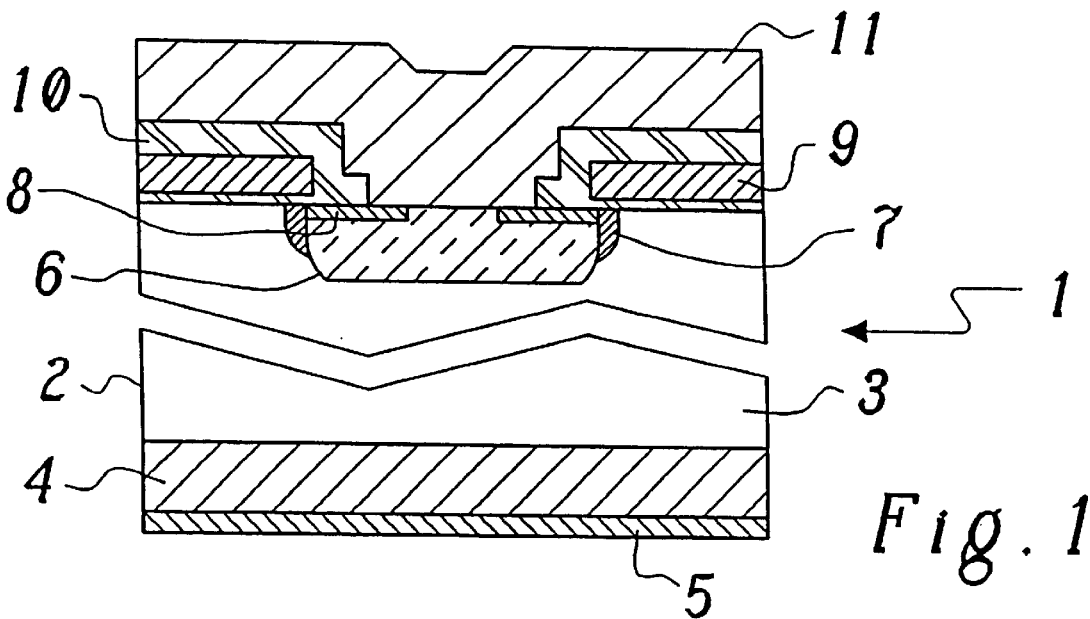
FIG. 1 shows a cross-section through the component cell of a known power IGBT.
Figures 2A, 2B:
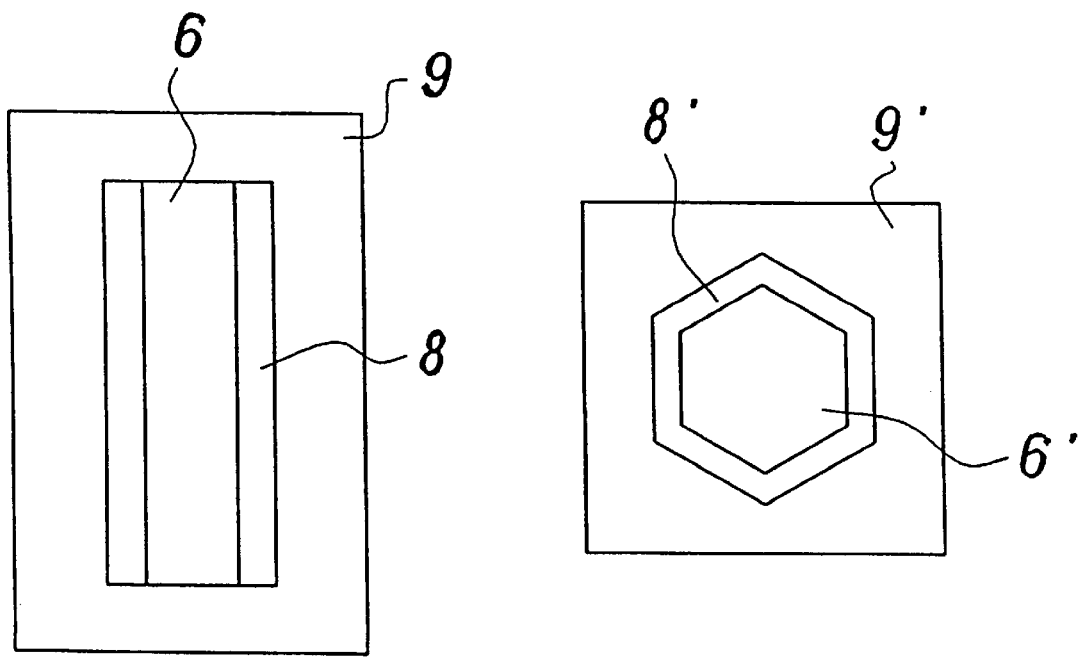
FIG. 2 shows a plan view of two known geometries of a component cell according to FIG. 1.
Figure 3:
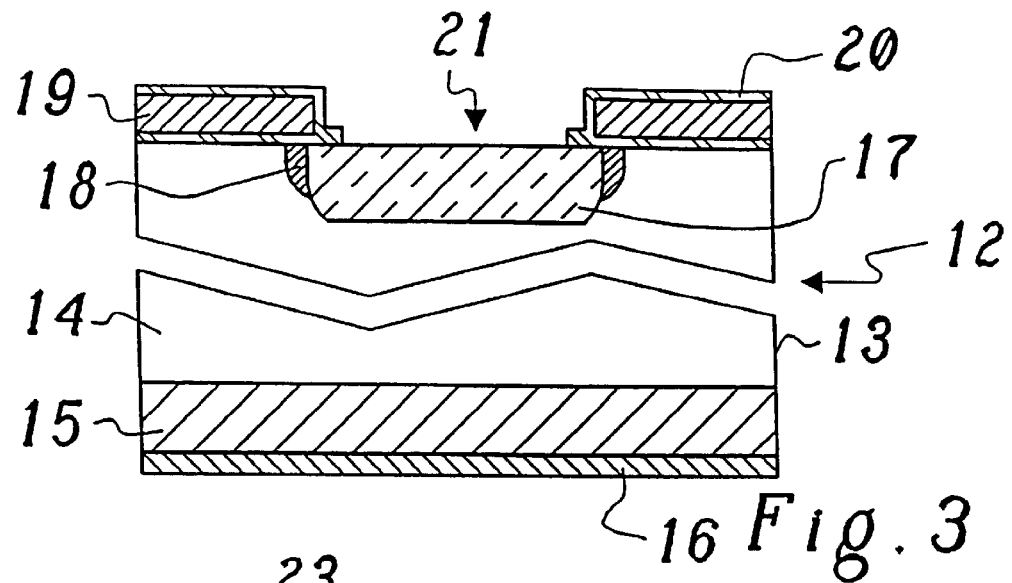
FIG. 3 shows the self-aligning implantation of emitter region and channel region in the case of a known IGBT cell.
Figure 4:
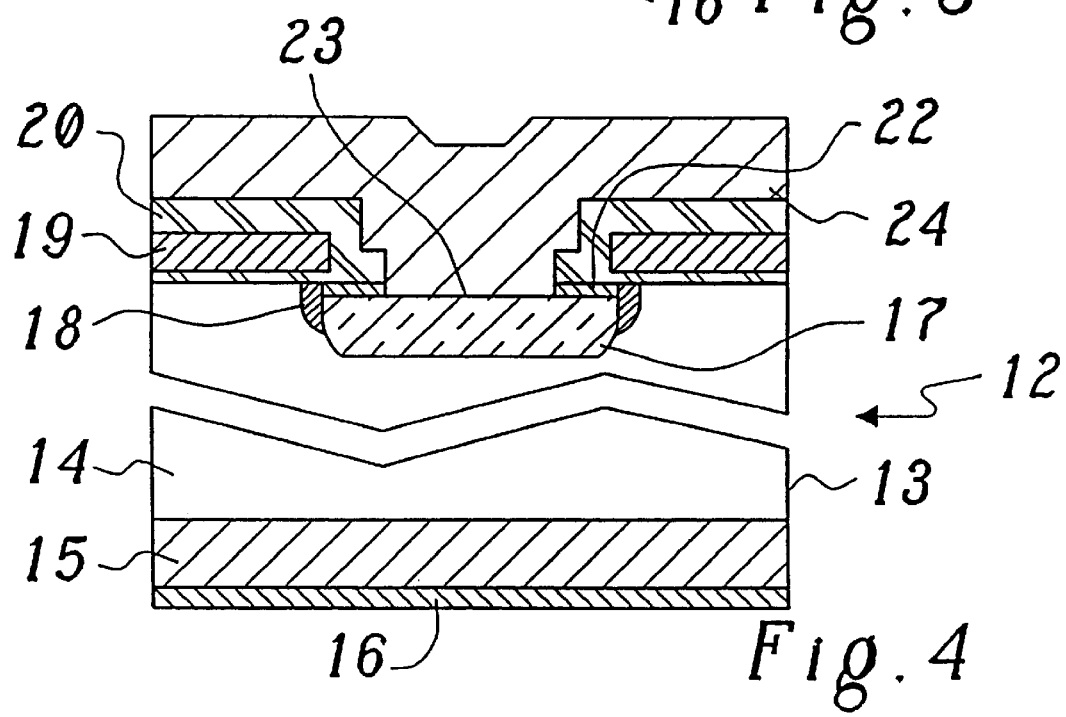
FIG. 4 shows the implantation and contact-making of the source regions in the cell according to FIG. 3.
Figures 5A, 5B:
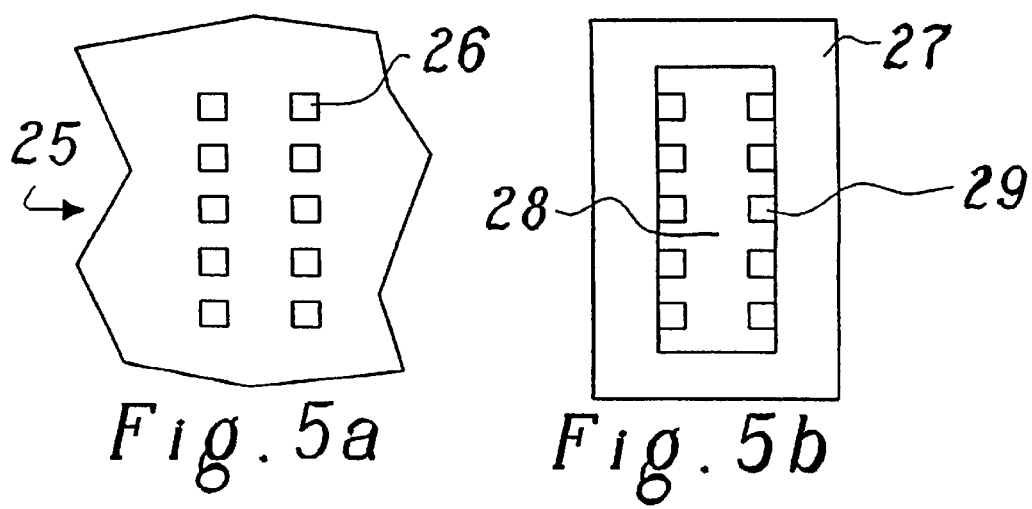
FIG. 5 shows a mask (a) for the known structuring of the source region and the resulting geometry of the IGBT cell (b)

Referring now to the drawings, wherein like reference numerals designate identical or corresponding parts throughout the several views, a first preferred exemplary embodiment of the method according to the invention is represented in various process steps in FIG. 6, an individual IGBT cell (to be produced) being shown in a perspective, sectional illustration. The process for the production of the MOS-controlled power semiconductor component 30 proceeds from a (Si) substrate 31, which is N-doped, for example. A $P^+$-doped layer, which forms the collector region 33 of the IGBT transistor in the IGBT cell, is introduced from underneath into the substrate 31. The rest of the substrate forms the base region 32 (FIG. 6(a)).

A mask 34 for the implantation of an emitter region 37 is then applied to the top side of the substrate 31 and a $P^+$-doped emitter region 37 is implanted through a mask opening 35 in the mask 34 (FIG. 6(b)). The special nature of the mask 34 in connection with the invention is that it has cutouts 36 which are arranged around the edge of the mask opening 35 and extend laterally outwards. The effect of this is that the introduced emitter region 37 has laterally outwardly extending fingers 38 in the region of the cutouts 36 (FIG. 6(c)). The length of the fingers 38 is in this case selected such that they—as will be explained below—project laterally at least beyond the subsequently introduced source region after the end of the process.

After the implantation of the emitter region 37 in the form of a strip has been completed and the mask 34 has been removed, the gate electrode 39, which is made of polysilicon and is surrounded by an oxide 40, is applied to the top side of the substrate 31 and structured. In this case, a window 41 arranged centrally over the emitter region 37 is opened (FIG. 6(d)). A P-doped channel region 42 (FIG. 6(e)) and an N$^+$-doped, planar source region 43 (FIG. 6(f)) are implanted one after the other into the substrate 31 through the window 41. Finally, in the region of the window 41, the top layer of the substrate 31 with the implanted source region 43 is additionally etched away (FIG. 6(g)), thereby enabling contact to be made both with the emitter region 37 and with the source regions 43 by a metallization layer applied over them.

The channel region 42 is indiffused until, in those regions of the emitter region 37 in which no fingers 38 are present, it projects laterally beyond the emitter region and extends to a point under the edge of the gate electrode 39 (FIG. 6(h)). In this way, the source region 43 is connected via the channel regions 42 to the base region 32 and forms, together with the superior gate electrode, the MOS channel structure for controlling the IGBT transistor. In those regions, on the other hand, in which the emitter region 37 is laterally extended further by the fingers 38, the source regions 43 are completely surrounded by the emitter region 37. The threshold voltage of these regions then lies above the gate-emitter voltage that is used, with the result that these regions are omitted for the control of the IGBT transistor. The resultant MOS channel structure is one in which actively controllable regions (outside the fingers 38) alternate with passive regions (inside the fingers 38). Both the level of the saturation current (power density in the event of a short circuit) and the hole bypass resistance can then be set by the width, depth and number (repetition rate) of the fingers 38. The fingers 38 in this case project laterally at least beyond the source regions 43. Alternatively, they can project laterally beyond the channel regions 42, which laterally adjoin the source regions 43.

FIG. 7 shows a process sequence, comparable to FIG. 6, for a further preferred exemplary embodiment of the method according to the invention. The method for the production of a MOS-controlled power semiconductor component 45 proceeds from a substrate 46 with base region (N-doped), collector region 48 (P$^+$-doped) and an already implanted P$^+$-type emitter region 49 in the form of a strip (FIG. 7(a)).

In the present case of high-power IGBTs, the distance between two component cells, one of which is considered in FIG. 7, is so large that (thick) field oxides can be used in order to keep the entire thin oxide area as small as possible (input capacitance, yield). A mask is required to structure a field oxide layer 52, applied beforehand over the whole area, on the substrate 46 between the IGBT cells, which mask fundamentally exposes the region of the cells but covers the region between the cells. Such a mask 50 is applied in modified form to the top side of the substrate 46 (FIG. 7(b)). The modification consists in the fact that the mask 50 has first fingers 51 which proceed from the edge of the mask region surrounding the component cell and extend inwards. If the field oxide layer 52 is subsequently etched, this field oxide layer 52 has inwardly extending second fingers 53 in the region of the first fingers 51 (FIG. 7(c)). These second fingers 53 extend inwards beyond the edge of the emitter region 49 (right-hand half of the sectional view in FIG. 7(c)), while outside the second fingers 53, the field oxide layer 52 ends at a point well before the emitter region 49 (left-hand half of the sectional view of FIG. 7(c)).

During the subsequent introduction of the source region into the substrate, the second fingers 53 prevent or mask formation of the source region in their region: in order to implant the channel region and the source region, once again—as in FIG. 6(d–f)—a structured gate electrode 54 (made of polysilicon), which is surrounded by an oxide 55, is applied to the substrate 46 and over the field oxide layer 52 and has a window 65, in the form of a strip, in the region of the component cell (FIG. 7(d)). On account of their length, the second fingers 53 of the field oxide layer 52 project partially into the opening of the window 65.

Figure 7E:
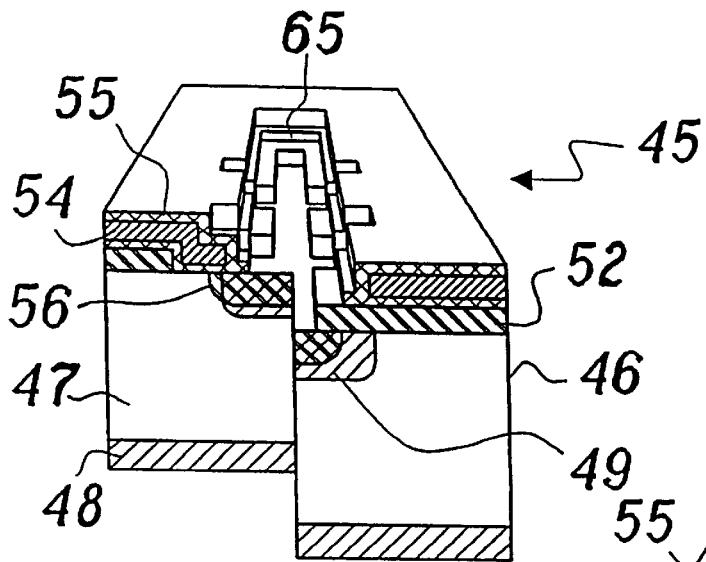
FIG. 7 shows various steps in the production of an IGBT in accordance with a second preferred exemplary embodiment of the method according to the invention, in which the field oxide layer is structured in order to structure the MOS channel structure.
Figure 7G:
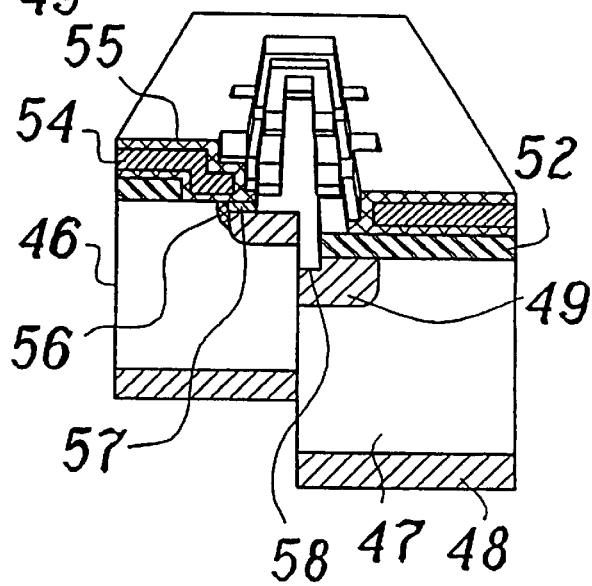
Figure 7F:
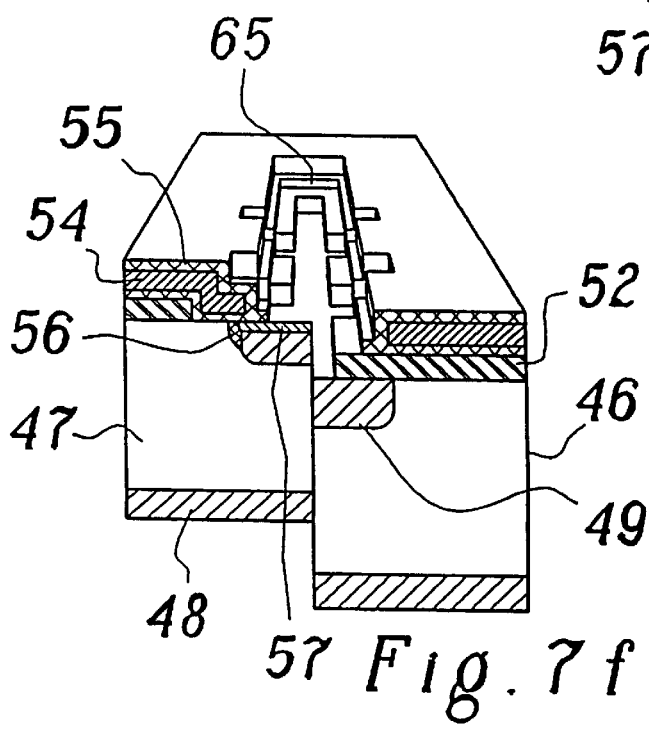

The P-doped channel region 56 (FIG. 7(e)) and the N$^+$-doped source region 57 (FIG. 7(f)) are implanted one after the other through the window 65. The fingers 53 projecting into the window 65 in this case prevent the formation of a MOS channel structure in the finger region. Finally, the central region of the source region 57 is once again etched out in order to enable contact to be made with the emitter region 49 through the resulting contact hole 58 (FIG. 7(g)). In the case of the finished cell, once again actively controllable regions (outside the second fingers 53, left-hand half of the cross-sectional view in FIG. 7(g)) alternate with passive regions (underneath the second fingers 53; right-hand half of the cross-sectional view in FIG. 7(g)) in this case, too. The channel width and thus the short-circuit current density can then be set by the width and number (repetition rate) of the second fingers 53.

Figure 8:
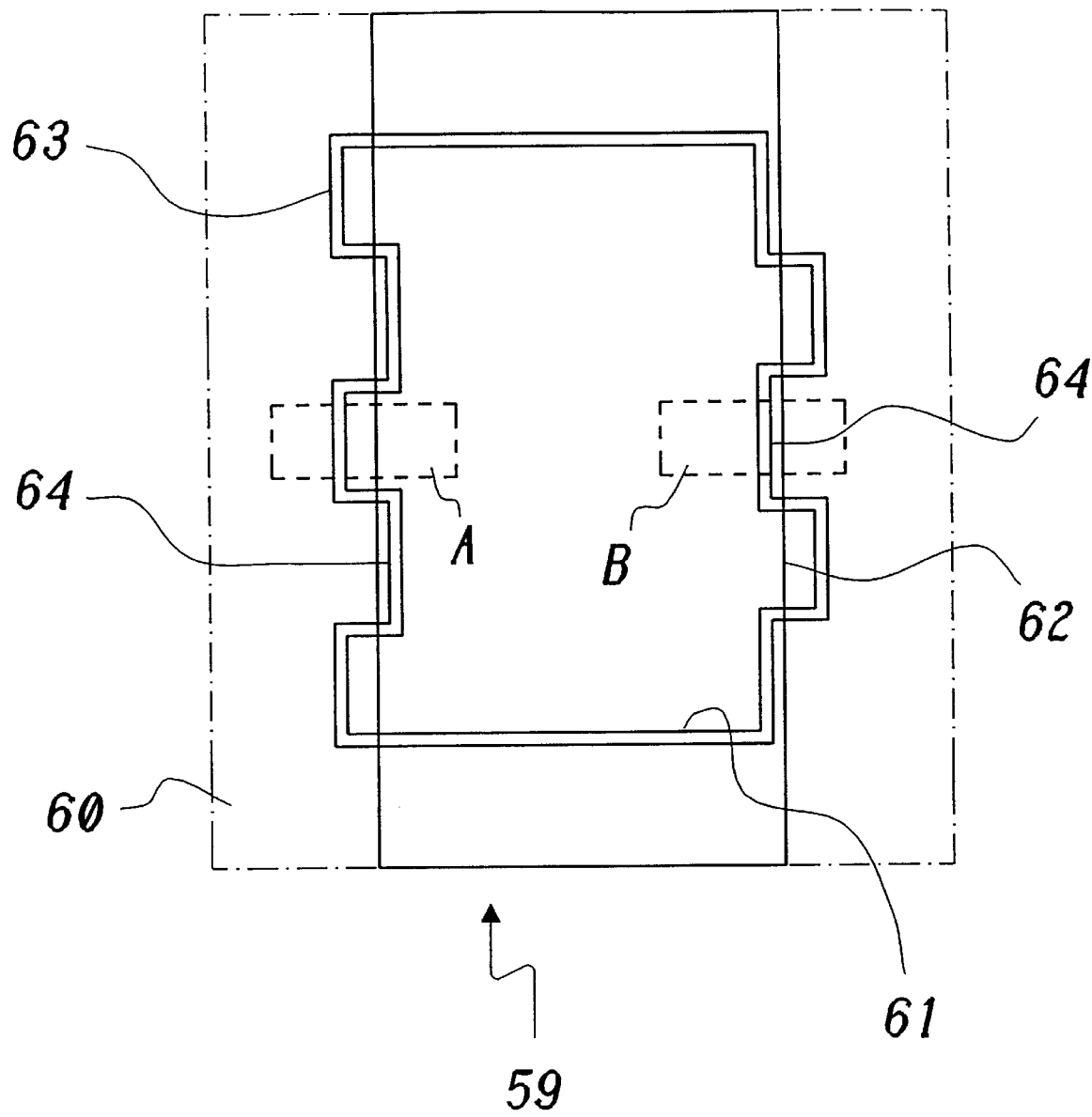
FIG. 8 shows a plan view of the geometry of an IGBT cell which has been produced in accordance with a third preferred exemplary embodiment of the method according to the invention, the polysilicon gate electrode being structured in order to structure the MOS channel structure.

A further preferred exemplary embodiment of the method according to the invention may be explained using the geometry, illustrated in FIG. 8, of the finished component cell 59: in the case of this component cell 59, the mask 62 for the emitter region has a simple rectangular opening, with the result that the emitter region is in simple strip form (as in FIG. 7(a)). The mask 63 for the gate electrode and thus the gate electrode 60 itself do not have—unlike in the cases of FIGS. 6 and 7—straight continuous longitudinal edges, rather the mask 63 has fingers 64. Fingers on the gate electrode 60 which extend inwards over the edge of the emitter region (mask 62) correspond to these fingers 64. During the implantation of the channel region and source region (see FIG. 6(e, f) or FIG. 7(e, f)), this structuring of the gate electrode 60 results in the desired structured MOS channel structure: a normal MOS control structure is produced in the region A (outside the fingers 64), the formation of a channel is prevented in the region B (inside the fingers 64) in that the implanted N$^+$-type source region lies completely inside the P$^+$-type emitter region (mask 62). In this case, too, the effective channel width can once again be set in a simple manner by the number (repetition rate) and width of the fingers 64. The mask 61 for the emitter contact region may—as indicated in FIG. 8—preferably follow the mask 63 in terms of its contour, thereby producing no additional emitter-ballast resistance.

Overall, the method according to the invention enables the production of a MOS-controlled power semiconductor component which is optimized with regard to the power density in the event of a short circuit and the hole bypass resistance, without requiring additional mask steps during production.

Obviously, numerous modifications and variations of the present invention are possible in light of the above teachings. it is therefore to be understood that within the scope of the appended claims, the invention may be practiced otherwise than as specifically described herein.

What is claimed as new and desired to be secured by Letters Patent of the United States is:

1. A method for the production of a MOS-controlled power semiconductor component, which power semiconductor component comprises, in a common substrate, a plurality of component cells which are arranged next to one another and are connected in parallel, a bipolar transistor formed by a collector region of a first conductivity type, a superior base region of a second conductivity type and an emitter region of the first conductivity type, which emitter region is incorporated from above into the base region, being present in each component cell, and a MOS channel structure for controlling the bipolar transistor being provided on the emitter side, which MOS channel structure comprises a source region of the second conductivity type, which source region lies above the emitter region, a channel region of the first conductivity type, which channel region is arranged on the edge side of the emitter region between the source region and the base region, and a gate electrode which is arranged in an insulated manner above the channel region, wherein said method includes a series of production steps including at least one production step to produce said source region and further at least one masking step to produce regions other than the source region, the channel width of the MOS channel structure is structured by one of said at least one masking steps, and said one of said at least one masking steps includes introducing the emitter region into the substrate.

2. The method as claimed in claim 1, wherein a mask is used for the mask step by means of which the emitter region is introduced into the substrate, which mask has cutouts which are arranged around the edge of a mask opening and extend laterally outwards, in such a way that the introduced emitter region has laterally outwardly extending fingers in the region of the cutouts, and wherein the length of the fingers is selected such that they project laterally at least beyond the subsequently introduced source region.

3. The method as claimed in claim 2, wherein the length of the fingers is selected such that they project laterally beyond the subsequently introduced channel region which laterally adjoins the source region.

4. The method as claimed in claim 2, wherein the channel width of the MOS channel structure is set by the number and width of the fingers.

5. A method for the production of a MOS-controlled power semiconductor component, which power semiconductor component comprises, in a common substrate, a plurality of component cells which are arranged next to one another and are connected in parallel, a bipolar transistor formed by a collector region of a first conductivity type, a superior base region of a second conductivity type and an emitter region of the first conductivity type, which emitter region is incorporated from above into the base region, being present in each component cell, and a MOS channel structure for controlling the bipolar transistor being provided on the emitter side, which MOS channel structure comprises a source region of the second conductivity type, which source region lies above the emitter region, a channel region of the first conductivity type, which channel region is arranged on the edge side of the emitter region between the source region and the base region, and a gate electrode which is arranged in an insulated manner above the channel region, wherein said method includes a series of production steps including at least one production step to produce said source region and further at least one masking step to produce regions other than the source region, the channel width of the MOS channel structure is structured by one of said at least one masking steps, said one of said at least one masking steps includes structuring a field oxide layer on the top side of the substrate between the component cells, and a mask used for the mask step by means of which the field oxide layer on the substrate is structured has first fingers which proceed from the edge of a mask region surrounding the component cell and extend inwards in such a way that the applied field oxide layer, which surrounds the component cells, has inwardly extending second fingers in a region of the first fingers, which second fingers prevent or mask formation of the source region in a region of the second fingers during the subsequent introduction of said source region.

6. The method as claimed in claim 5, wherein the channel width of the MOS channel structure is set by the number and width of the second fingers.

7. A method for the production of a MOS-controlled power semiconductor component, which power semiconductor component comprises, in a common substrate, a plurality of component cells which are arranged next to one another and are connected in parallel, a bipolar transistor formed by a collector region of a first conductivity type, a superior base region of a second conductivity type and an emitter region of the first conductivity type, which emitter region is incorporated from above into the base region, being present in each component cell, and a MOS channel structure for controlling the bipolar transistor being provided on the emitter side, which MOS channel structure comprises a source region of the second conductivity type, which source region lies above the emitter region, a channel region of the first conductivity type, which channel region is arranged on the edge side of the emitter region between the source region and the base region, and a gate electrode which is arranged in an insulated manner above the channel region, wherein said method includes a series of production steps including at least one production step to produce said source region and further at least one masking step to produce regions other than the source region, the channel width of the MOS channel structure is structured by one of said at least one masking steps, said one of said at least one masking steps includes structuring the gate electrode on the substrate, and a mask used for the mask step by means of which the gate electrode on the substrate is structured has first fingers which proceed from the edge of a mask region surrounding the component cell and extend inwards in such a way that the applied gate electrode has inwardly extending second fingers in a region of the first fingers, which second fingers prevent or mask the formation of a channel structure in a region of the second fingers during the subsequent introduction of the source region.

8. The method as claimed in claim 7, wherein the channel width of the MOS channel structure is set by the number and width of the second fingers.

9. The method as claimed in claim 3, wherein the channel width of the MOS channel structure is set by the number and width of the fingers.

* * * * *